United States Patent [19]
Bill et al.

[11] Patent Number: 6,118,694
[45] Date of Patent: Sep. 12, 2000

[54] DISTRIBUTING CFI DEVICES IN EXISTING DECODERS

[75] Inventors: Colin S. Bill, Cupertino; Feng Pan, Richmond, both of Calif.

[73] Assignee: Advanced Micro Devices, Inc., Sunnyvale, Calif.

[21] Appl. No.: 09/417,731

[22] Filed: Oct. 14, 1999

[51] Int. Cl.[7] .................................................. G11C 14/00
[52] U.S. Cl. .............................. 365/185.08; 365/185.11; 365/185.33
[58] Field of Search ..................... 365/185.21, 185.33, 365/185.08, 185.11; 711/103, 104

[56] References Cited

U.S. PATENT DOCUMENTS

| | | | |
|---|---|---|---|
| 5,648,929 | 7/1997 | Miyamoto | 365/185.04 |
| 5,889,721 | 3/1999 | Gannage | 365/226 |
| 5,893,135 | 4/1999 | Hasbun et al. | 711/103 |
| 5,926,810 | 7/1999 | Noble et al. | 707/4 |
| 5,937,423 | 7/1999 | Robinson | 711/103 |

*Primary Examiner*—Son T. Dinh
*Assistant Examiner*—Hien Nguyen
*Attorney, Agent, or Firm*—Brinks Hofer Gilson & Lione

[57] ABSTRACT

The present invention discloses a CFI bit line decoder for a memory device that is capable of storing common flash interface data. In the preferred embodiment, the CFI bit line decoder has at least one bit line decoder circuit including at least one pass gate and a plurality of bit line pass gates, wherein each pass gate is electrically connected with at least one pass gate. In addition, the CFI bit line decoder includes at least one CFI storage circuit that has at least one storage cell electrically connected with the bit line decoder circuit. Each storage cell is in turn electrically connected with the bit line pass gate of the bit line decoder circuit. During CFI mode, a vertical address signal is used to enable a respective pass gate and a CFI address signal is used to enable a respective storage cell. A read circuit is then used to sense the logic state of the storage cell so that a peripheral device can use the data.

17 Claims, 2 Drawing Sheets

2

DISTRIBUTING CFI DEVICES IN EXISTING DECODERS

FIELD OF THE INVENTION

The present invention relates generally to common flash interface ("CFI") for nonvolatile memory devices and, more particularly, to a method and system of distributing CFI devices in existing decoders.

BACKGROUND OF THE INVENTION

Flash memories are popular memory storage devices because they store information in the absence of continuous power and are capable of being constructed in a very compact form. Flash memory is typically constructed by fabricating a plurality of floating gate transistors in a silicon substrate. A floating gate transistor is capable of storing electrical charge either on a separate gate electrode, known as a floating gate, or in a dielectric layer underlying a control gate electrode. Generally speaking, data is stored in a nonvolatile memory device by the storage of an electrical charge in the floating gate.

A cell is typically programmed by applying a predetermined voltage to the control gate, a second predetermined voltage to the drain, and grounding the source. This causes channel hot electrons to be injected from the drain depletion region into the floating gate. The predetermined voltages that are used during the programming operation are typically higher than the supply voltage ("Vcc"). When reading a cell, if the cell is programmed, the threshold voltage will be relatively high and the bit line current will be zero or relatively low. If the cell is not programmed or erased, the threshold voltage will be relatively low, the control gate voltage will enhance the channel and the bit line current will be relatively high.

Common flash interface or CFI, in one form or another, was introduced to help standardize the method in which peripheral devices can obtain operating information about the flash memory during operation. When operating in CFI mode and "Query Command" is received, the flash memory is capable of providing peripheral devices with information regarding the size, geometry and capability of the flash memory. Flash memory that supports CFI use the "Query Command" to cause the flash memory to return information about the flash memory to the peripheral device. After the "Query Command" has been issued, the flash memory enters the "Query mode," thereby generating a read output of the CFI Query data structure. The CFI Query data structure contains a command set and control interface ID code that specifies a vendor-specific control interface for a family of flash memory.

The Query data structure also contains common flash memory parameters and vendor-specified data areas. This information provides the peripheral device with all the necessary information for controlling Read/Write/Erase operations for a particular family of flash memory according to a vendor-specified interface. Any additional information not contained in the common CFI Query data structure is located in vendor-specific extended Query tables, the address locations of which are contained in the general CFI Query data structure. CFI allows flash memory vendors to standardize their existing interfaces for long-term compatibility with families of flash memory.

In prior art flash memory, the CFI logic was incorporated into a separate portion of the chip as a read only memory ("ROM") array consisting of a plurality of rows and columns of transistors. The amount of information stored in the CFI logic requires approximately 64 bytes (512 bits) of storage capacity. In order to decode and retrieve the information contained in the ROM, extra peripheral logic was added to the flash memory. In particular, an x-decoder circuit and a y-decoder circuit were needed to decode the information stored in the ROM array. The CFI information was also stored in a memory matrix that was accessed by the x-decoder circuit and the y-decoder circuit while the flash memory was in CFI mode. As one skilled in the art would recognize, the addition of these extra circuits to the flash memory increases the die size of the flash memory. In addition, if the size of the CFI array needs to expand due to the addition of more CFI data, even more area will be required if the current CFI architecture is used.

To that end, a need exists in flash memory for a method and system of providing flash memory with CFI architecture without substantially increasing the die size of the flash memory and the need for additional logic circuits.

SUMMARY OF THE PRESENT INVENTION

The present invention discloses a memory device that stores CFI data in decoders distributed throughout the memory device. The preferred memory device includes an address buffer, at least one wordline decoder, at least one CFI bit line decoder, a memory core and a read circuit. In the preferred embodiment, the CFI data is stored in the CFI bit line decoder thereby eliminating the need for a separate area in the substrate of the memory device for the CFI data. The present invention overcomes problems with prior art methods and systems by minimizing the additional space and circuitry required to store the CFI data.

As known in the art, a plurality of address lines are electrically connected with the address buffer, which interprets signals received from the address lines to select appropriate decoder circuits during operation. While the memory device is operating in the CFI mode, the address lines are used to select predetermined storage cells in the CFI bit line decoder. Once the predetermined storage cells are selected in the CFI bit line decoder, the data stored in the cells is transferred to the read circuit so that the peripheral device using the memory device can read the CFI data.

In the preferred embodiment of the present invention, a first set of address lines electrically connects the address buffer with the wordline decoder. As known in the art, during normal operation the memory device uses the wordline decoder to select a predetermined wordline in the memory core. The wordline decoder is electrically connected with the memory core with a plurality of wordline decoder output lines. Although the wordline decoder is not used while the memory device is in the CFI mode, those skilled in the art would recognize that the wordline decoder is used to select predetermined wordlines in the memory core during operations such as read, write and erase.

A second set of address lines electrically connects the address buffer with the CFI bit line decoder. A plurality of select lines electrically connects the CFI bit line decoder with the bit lines of the memory core. During normal operation, the memory device uses the CFI bit line decoder as the primary bit line decoder to select a predetermined bit line that is electrically connected with the drain of a flash transistor in the memory core. As such, the CFI bit line decoder is capable of operating like a conventional bit line decoder during operations such as read, write and erase.

A CFI decoder output line is used to electrically connect the CFI bit line decoder with the read circuit. As known in the art, the read circuit is used by the memory device during operation to sense the state of cells in the memory core. For the purpose of the present invention, it is only necessary to understand that the read circuit is used to determine if cells are in a conducting ("logic 1") or non-conducting ("logic 0") state. Once the CFI bit line decoder selects a particular cell to be read, a signal is passed to the read circuit that determines the state of the cell being read. Those skilled in the art would recognize that several types of read circuits exist and may be used in the present invention.

The preferred CFI bit line decoder includes a bit line decoder circuit and a CFI storage circuit. In the preferred embodiment, the second set of address lines from the address buffer are divided into a plurality of vertical address lines and at least one CFI address line. The vertical address lines electrically connect the address buffer with the bit line decoder circuit and the CFI address lines electrically connect the buffer circuit with the CFI storage circuit. The CFI storage circuit is also electrically connected with the bit line decoder circuit.

When the memory device is operating in the CFI mode, a predetermined CFI address line is used to select a respective storage cell in the CFI storage circuit. In addition, a predetermined vertical address line is used to connect the storage cell with the read circuit. As such, during the CFI mode a predetermined CFI address line and a predetermined vertical address line are used to select a respective storage cell in the CFI storage circuit. Once selected by the appropriate address line combination, the read circuit is capable of sensing the data value on the selected cell of the CFI storage circuit.

The present invention overcomes the problems associated with prior art CFI architecture by minimizing the area needed to store the CFI data used during the CFI mode. Due to the size of the memory core, each respective CFI bit line decoder is capable of storing the CFI data in areas of the memory device that were not used. In addition, since the CFI data is incorporated into an existing decoder, the bit line decoder circuit is capable of being used to select respective storage cells thereby eliminating the need for additional decoder circuits required for the CFI mode only.

These and other features and advantages of the invention will become apparent upon consideration of the following detailed description of the presently preferred embodiments of the invention, viewed in conjunction with the appended drawings.

DETAILED DESCRIPTION OF THE PRESENTLY PREFERRED EMBODIMENTS OF THE INVENTION

The exemplary embodiments of the invention are set forth below with reference to specific configurations, and those skilled in the art would recognize that various changes and modifications can be made on the specific configurations while remaining within the scope of the claims. The invention may be used with any type of memory device; however, the preferred embodiment of the invention is designed for a flash memory. The invention may also be used with flash memory devices that use Fowler-Nordheim (F-N) or channel hot electron (CHE) injection for erase and programming.

Figure 1:
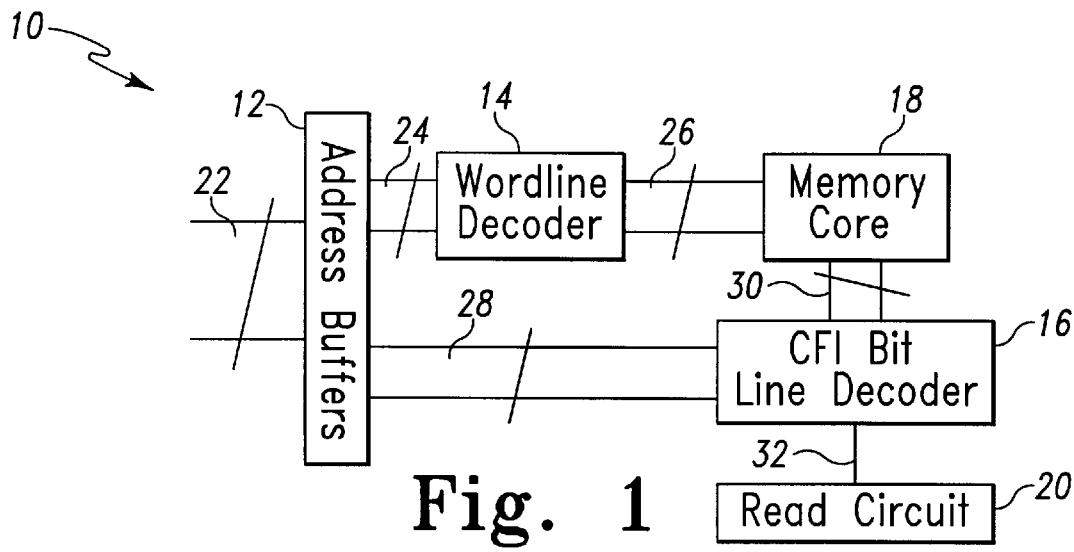
FIG. 1 is a block diagram of the preferred memory device with CFI distributed in a decoder.

Referring to FIG. 1, the present invention discloses a memory device 10 with common flash interface data stored in decoders used by the memory device 10. In the preferred embodiment of the present invention, the memory device 10 is a flash memory. As illustrated, the memory device 10 includes an address buffer 12, at least one wordline decoder 14, at least one CFI bit line decoder 16, a memory core 18 and a read circuit 20. The address buffer 12 is electrically connected with the wordline decoder circuit 14 and the CFI bit line decoder 16. The wordline decoder 14 and the CFI bit line decoder 16 are electrically connected with the memory core 18. The CFI bit line decoder 16 is also electrically connected with the read circuit 20.

As known in the art, a plurality of address lines 22 are electrically connected with the address buffer 12, which interprets information received from electric signals on the address lines 22 to select appropriate circuits during operation. In general, the address buffer 12 receives address signals from a peripheral device that is connected with the memory device 10. Those skilled in the art would recognize that several different types of address buffers exist and may be used in the present invention.

A first set of address lines 24 electrically connect the address buffer 12 with the wordline decoder 14. As known in the art, during operation the memory device 10 uses the wordline decoder 14 to select a predetermined wordline (not illustrated) in the memory core 18. The wordline decoder 14 is electrically connected with the memory core 18 by a plurality of wordline decoder output lines 26. Although the wordline decoder 14 is not used in the CFI mode, a plurality of wordline decoders 14 are used to select predetermined wordlines in the memory core 18 during operations such as read, write and erase.

As further illustrated in FIG. 1, a second set of address lines 28 electrically connect the address buffer 12 with the CFI bit line decoder 16. Although not illustrated in FIG. 1, the second set of address lines 28 comprises address lines designated (YD2 [0–3]), (YD1 [0–7]) and (CFI [0–1]) for the purposes of the present invention. Those skilled in the art would recognize that the number of address lines set forth above is by way of example only and should not be construed as a limitation of the present invention.

A plurality of select lines 30 electrically connect the CFI decoder 16 with the memory core 18. As known in the art, during normal operation the memory device 10 uses the CFI bit line decoder 16 to select a predetermined select line 30 that is typically connected with the drain of a column of flash transistors (not shown) in the memory core 18. As such, the CFI bit line decoder 16 is capable of operating like a conventional bit line decoder during operations such as read, write and erase. However, as set forth in detail below, in the preferred embodiment of the present invention the CFI decoder 16 is also used to store and retrieve CFI data used by peripheral devices connected with the memory device 10.

A CFI decoder output line 32 is used to electrically connect the CFI bit line decoder 32 with the read circuit 20. As known in the art, the read circuit 20 is used by the memory device 10 during operation to sense the logic state of cells it is connected with during operation. For the purpose of the present invention, it is only necessary to understand that the read circuit 20 is capable of determining if cells are in a conducting ("logic 1") or non-conducting ("logic 0") state. During operation, once the CFI bit line decoder 16 selects a respective cell to be read, the read circuit 20 is capable of sensing the state of the cell that is connected with the read circuit 20. Those skilled in the art would recognize that several types of read circuits 20 exist and may be used in the present invention.

Figure 2:
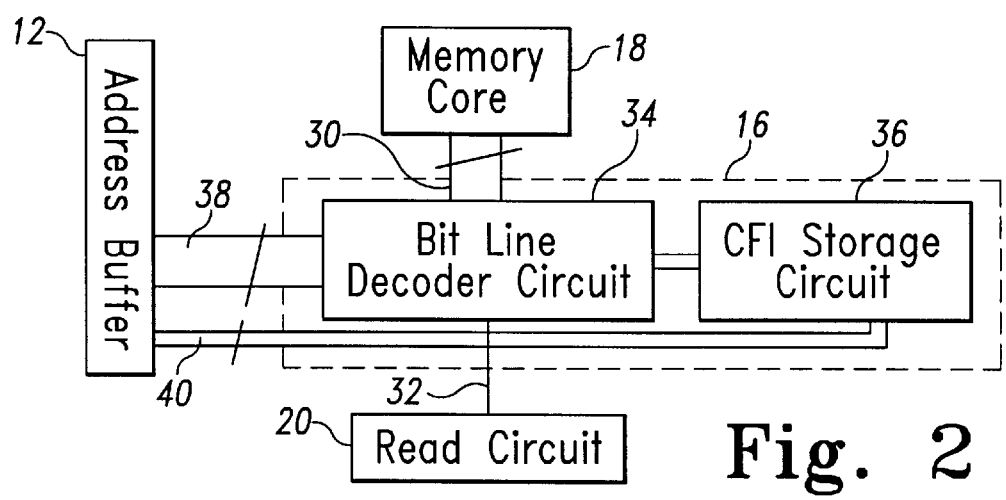
FIG. 2 is a block diagram of the preferred memory device illustrated in FIG. 1 with a detailed block diagram illustrating the preferred CFI bit line decoder.

Referring to FIG. 2, a preferred embodiment of the CFI bit line decoder 16 is illustrated in greater detail. The preferred CFI bit line decoder 16 includes a bit line decoder circuit 34 and a CFI storage circuit 36. In the preferred embodiment, the second set of address lines 28 from the address buffer 12 are divided into a plurality of vertical address lines (YD2 [0–4], YD1 [0–7]) 38 and at least one CFI address line (CFI [0–1]) 40. The vertical address lines (YD2 [0–4], YD1 [0–7]) 38 connect the address buffer 12 with the bit line decoder circuit 34.

The select lines 30 are used to electrically connect the memory core 18 with the bit line decoder circuit 34. The bit line decoder circuit 34 is also electrically connected with the read circuit 20 by the CFI decoder output line 32. As further illustrated in FIG. 2, the CFI storage circuit 36 is electrically connected with the bit line decoder circuit 34. In addition, the CFI storage circuit 36 is also electrically connected with the address buffer 12 by at least one CFI address line 40.

Figure 3:
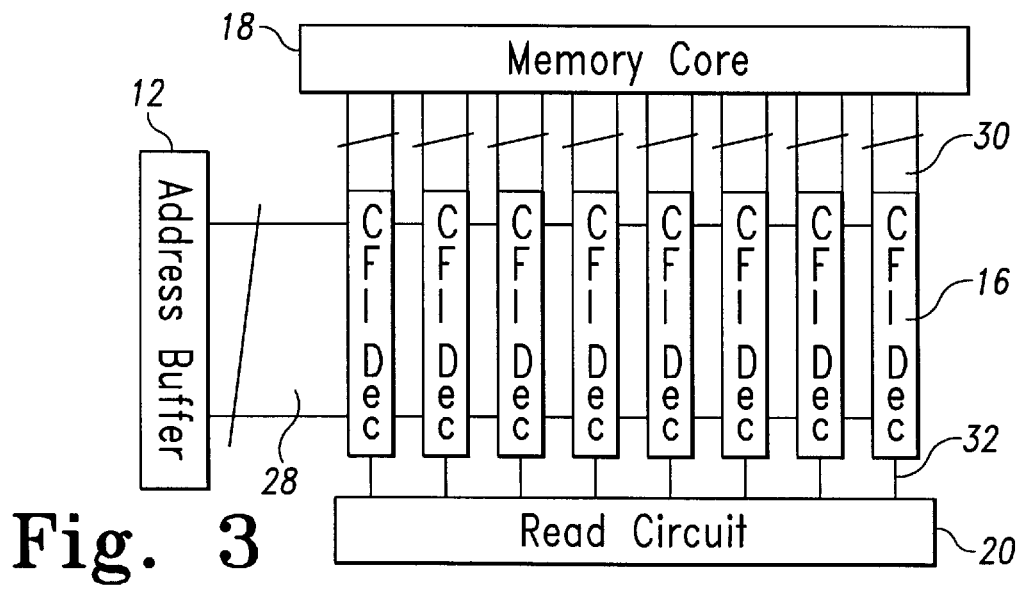
FIG. 3 is a block diagram of the preferred memory device illustrating a plurality of CFI bit line decoder circuits in the memory device.

Referring to FIG. 3, in another preferred embodiment of the present invention a plurality of CFI bit line decoders 16 are used in the memory device 10. As depicted, the second set of address lines 28 are used to connect the address buffer 12 with the CFI bit line decoders 16. As set forth in detail below, each CFI bit line decoder may include a plurality of CFI storage circuits 34. Those skilled in the art would recognize that the number of address lines from the address buffer would increase to accommodate each bit line decoder 16. In the preferred embodiment illustrated in FIG. 3, eight bits of data could be read from the read circuit 20. The number of bits the read circuit 20 can output at one time can vary in alternative embodiments of the invention and the number disclosed should not be construed as a limitation of the present invention.

Referring generally to FIGS. 2 and 3, the address buffer 12 uses the second set of address lines 28 to access predetermined data stored in the CFI storage circuit 36 when the memory device 10 is in CFI mode. The bit line decoder circuit 34 of the CFI bit line decoder 16 passes data stored in the CFI storage circuit 36 to the read circuit 20. During CFI mode, a respective combination of vertical address lines 38 and at least one CFI address line 40 are used to select a particular cell (not shown) in the CFI storage circuit 36.

Figure 4:
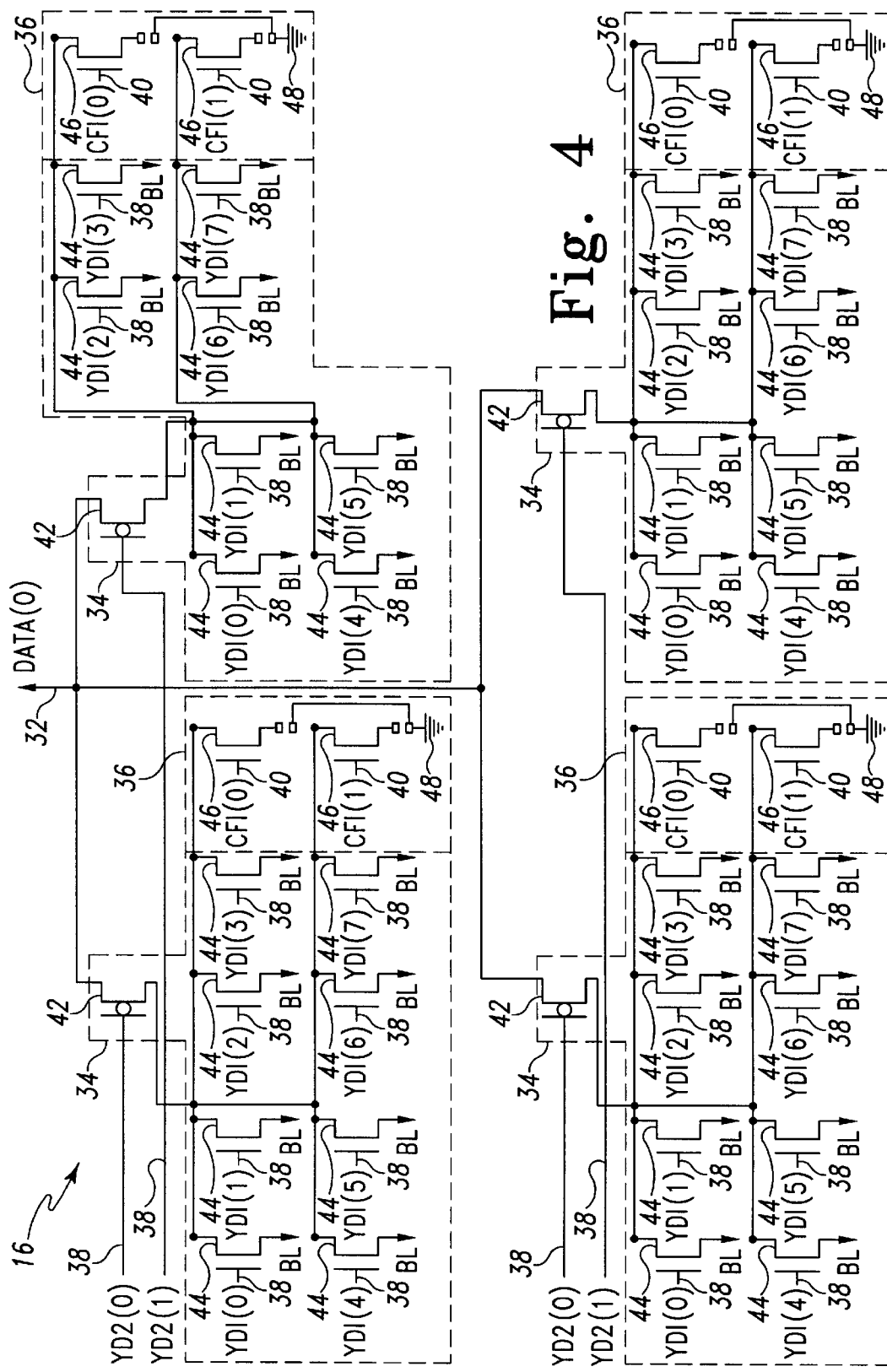
FIG. 4 is a detailed circuit schematic of the preferred CFI bit line decoder in the memory device.

Referring to FIG. 4, a detailed circuit schematic of the preferred CFI bit line decoder 16 is illustrated. As illustrated, the preferred CFI bit line decoder 16 includes at least one bit line decoder circuit 34 and at least one CFI storage circuit 36. The bit line decoder 34 includes at least one pass gate 42 and a plurality of bitline pass gates 44. In the preferred embodiment of the invention, the pass gate 42 is an n-channel intrinsic transistor and the bitline pass gates 44 are n-channel enhancement transistors. As readily apparent to those skilled in the art, four sets of bit line decoder circuits 34 and CFI storage circuits 36 are illustrated in FIG. 4. Those skilled in the art would recognize that the number of bit line decoder circuits 34 and CFI storage circuits 36 can vary in alternative embodiments of the present invention.

Each respective bit line decoder circuit 34 has at least one vertical address line 38 (YD2 [0–4]) electrically connected with the gate of a respective pass gate 42. In addition, each bit line decoder circuit 34 has a plurality of vertical address lines 38 (YD1 [0–7]) electrically connected with the gates of a respective bit line pass gates 44. Although not illustrated in FIG. 4, the source of each respective bit line pass gate 44 is typically connected with a respective bitline in the memory core 18. The drain of each respective bit line pass gate 44 is electrically connected with the source of the pass gate 42. The drain of pass gate 42 is used as the CFI decoder output line 32 and although not illustrated in FIG. 4, each respective drain of the pass gate 42 used are electrically connected with a respective input of the read circuit 20.

As previously set forth, the CFI storage circuit 36 is electrically connected with the bit line decoder circuit 34. Each CFI storage circuit 36 includes at least one CFI storage cell 46 and a ground connection 48. In the preferred embodiment, the CFI storage cells 46 comprise n-channel transistors. As illustrated in FIG. 4, the drain of each respective CFI storage cell 46 is electrically connected with the drains of the bit line pass gates 44 in the bit line decoder circuit 34. The gate of each respective CFI storage cell 46 is electrically connected with a respective CFI address line (CFI [0–1]) 40.

In the preferred embodiment of the invention, the source of each respective CFI storage cell 46 in the CFI storage circuit 34 may or may not be connected with the ground connection 48. As previously set forth, the data stored in the CFI storage circuit 36 is used when the memory device 10 is operating in the CFI mode. In the preferred embodiment, if the source of CFI storage cell 46 is left floating the read circuit 20 senses the data stored in the CFI storage cell 46 as a logic low ("0"). If the source of the CFI storage cell 46 is connected with the ground connection 48, the read circuit 20 senses the data stored in the CFI storage cell 46 as a logic high ("1"). Those skilled in the art would recognize that the disclosed CFI storage circuit 46 is by way of example only and that other variations may exist that remain within the scope of the present invention.

During the CFI mode, the vertical address lines (YD1 [0–7]) 38 that are connected with the gates of the bit line pass gates 44 are disabled so that information stored in the memory core 18 does not disturb the output of the CFI storage circuit 36. A vertical address line (YD2 [0–3]) 38 that is electrically connected with a respective pass gate 44 is enabled so that the data stored in the selected CFI storage circuit 34 can be sensed by the read circuit 20. The vertical address lines (YD2 [0–3]) 38 that are not being used are disabled so that an erroneous reading is not made by the read circuit 20.

Referring generally to FIGS. 2 and 4, the present invention discloses a method of reading common flash interface data stored in decoders in a memory device 10. In the present invention, at least one CFI bit line decoder 16 is provided that includes at least one bit line decoder circuit 34 and at least one CFI storage circuit 36. During the CFI mode, a predetermined pass gate 42 is enabled in the bit line decoder circuit 34 with a predetermined vertical address signal from the vertical address lines 38. In addition, a predetermined storage cell 46 is also enabled in the CFI storage circuit 36 with a predetermined CFI address line 40. Once the pass gate 42 and storage cell 46 have been enabled, a read circuit 20 senses the logic state of the CFI storage circuit 36.

In the preferred embodiment, a plurality of address lines 22 direct a plurality of address signals to an address buffer 12. The address buffer 12 interprets the address signals and directs a plurality of address signals from the address buffer 12 to at least one CFI bit line decoder 16. As previously set forth, the second set of address lines 28 from the address buffer 12 are divided into a plurality of vertical address lines (YD1 [0–7], YD2 [0–3]) 38 and at least one CFI address line (CFI [0–1]) 40.

In the CFI mode, vertical address lines (YD1 [0–7]) 38 are disabled so that the information stored in the memory core 18 does not inadvertently get gated to the CFI decoder output line 32. If vertical address lines (YD1 [0–7]) 38 were not disabled or grounded, the signals from the memory core 18 would be passed to the read circuit 20 thereby causing errors when reading the information stored in the CFI storage circuit 34. A predetermined vertical address line (YD2 [0–3]) 38 is used by the memory device 10 to select a particular CFI storage circuit 34, thereby providing a path between the chosen CFI storage circuit 36 and the read circuit 20. In addition, in the preferred embodiment a respective CFI address line (CFI [0–1]) 40 is enabled to control which storage cell 46 in the CFI storage circuit 36 is being sensed by the read circuit 20.

Once the predetermined vertical address line (YD2 [0–3]) 38 and CFI address line (CFI [0–1]) 40 have been enabled, the read circuit 20 is capable of determining the state of the chosen storage cell 46 in the CFI storage circuit 36. As previously set forth, if the source of n-channel transistor is grounded the read circuit 20 will sense the data stored as a logic high ("1"). Likewise, if the source of the n-channel transistor is left floating, the read circuit 20 will sense the information stored as a logic low ("0").

Although the detailed description describes embodiments using a flash EPROM, the invention may be used with any nonvolatile writeable memory, including, but not limited to, EPROMs, EEPROMs, and flash memories, including technologies such as NOR, NAND, AND, Divided bit-line NOR (DINOR), and Ferro-electric Random Access Memory (FRAM). While the present invention has been described with reference to specific exemplary embodiments, it will be evident that various modifications and changes may be made to these embodiments without departing from the broader spirit and scope of the invention as set forth in the claims. Accordingly, the specification and drawings are to be regarded in an illustrative rather than a restrictive sense.

What is claimed is:

1. A CFI bit line decoder for a memory device capable of storing common flash interface data, comprising:
   at least one bit line decoder circuit including at least one pass gate and a plurality of bitline pass gates, wherein each pass gate is electrically connected with at least one pass gate; and
   at least one CFI storage circuit including at least one storage cell electrically connected with said bit line decoder circuit, wherein said storage cell is electrically connected with said bit line pass gate of said bit line decoder circuit.

2. The CFI bit line decoder of claim 1, wherein said at least one pass gate comprises an n-channel enhancement transistor.

3. The CFI bit line decoder of claim 1, wherein each said bit line pass gate comprises an n-channel transistor.

4. The CFI bit line decoder of claim 1, wherein said storage cell comprises an n-channel transistor.

5. A memory device having common flash interface data distributed in at least one decoder circuit, comprising:
   a plurality of address lines electrically connected with an address buffer;
   at least one CFI bit line decoder electrically connected with said address buffer, wherein said CFI bit line decoder further comprises a bit line decoder circuit and a CFI storage circuit, and
   a read circuit electrically connected with said CFI bit line decoder circuit for sensing the logic state of a predetermined storage cell in said CFI storage circuit.

6. The memory device of claim 5, wherein each CFI bit line decoder is connected with said address buffer with a plurality of vertical address lines and at least one CFI address line.

7. The memory device of claim 6, wherein said vertical address lines are electrically connected with said bit line decoder circuit.

8. The memory device of claim 6, wherein said at least one CFI address line is electrically connected with said CFI storage circuit.

9. The memory device of claim 7, wherein a respective vertical address line is used to enable a predetermined pass gate in said bit line decoder circuit.

10. The memory device of claim 8, wherein a respective CFI address line is used to enable a predetermined storage cell in said CFI storage circuit.

11. The memory device of claim 5, wherein said bit line decoder circuit comprises a plurality of n-channel transistors.

12. The memory device of claim 5, wherein said storage cell comprises an n-channel transistor.

13. A method of reading common flash interface data stored in decoders in a memory device, comprising the steps of:
   providing at least one CFI bit line decoder including at least one bit line decoder circuit and at least one CFI storage circuit;
   enabling a predetermined pass gate in said bit line decoder circuit with a predetermined vertical address signal;
   enabling a predetermined storage cell in said CFI storage circuit with a predetermined CFI address signal; and
   sensing a CFI decoder output line from said CFI bit line decoder with a read circuit to determine the logic state of said storage cell in said CFI storage circuit.

14. The method of claim 13, wherein said pass gate is a n-channel transistor.

15. The method of claim 13, wherein said storage cell is a n-channel transistor.

16. The method of claim 13, wherein said predetermined vertical address signal is generated by a address buffer.

17. The method of claim 13, wherein said predetermined CFI address signal is generated by a address buffer.

* * * * *